United States Patent
Tinsley et al.

(10) Patent No.: US 6,411,126 B1
(45) Date of Patent: Jun. 25, 2002

(54) OUTPUT SLEW RATE CONTROL FOR A DIFFERENTIAL TRANSMISSION LINE DRIVER

(75) Inventors: Steven J. Tinsley, Garland; Julie Hwang, Richardson; Mark W. Morgan, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/747,271

(22) Filed: Dec. 21, 2000

(51) Int. Cl.[7] .............................................. H03K 19/08
(52) U.S. Cl. ............................ 326/83; 326/30; 326/115
(58) Field of Search ............................. 326/26, 27, 30, 326/83, 86, 115, 126

(56) References Cited

U.S. PATENT DOCUMENTS

| 4,471,242 | A | * | 9/1984 | Noufer et al. ................. 326/70 |
| 5,677,642 | A | * | 10/1997 | Rehm ........................... 327/65 |
| 5,717,343 | A | * | 2/1998 | Kwong .......................... 326/83 |
| 6,054,874 | A | * | 4/2000 | Sculley et al. ................. 326/82 |
| 6,087,853 | A | * | 7/2000 | Huber et al. ................... 326/83 |

* cited by examiner

*Primary Examiner*—Don Phu Le
(74) *Attorney, Agent, or Firm*—J. Dennis Moore; W. James Brady, III; Frederick J. Telecky, Jr.

(57) ABSTRACT

The output slew rate of a differential transmission line driver (13) can be limited by suitably controlling signal slew rates (52) at the control inputs (neg, pos) of the drive switches (M1–M4) that control current flow through the load impedance (Rload) of the driver.

4 Claims, 2 Drawing Sheets

FIG. 3
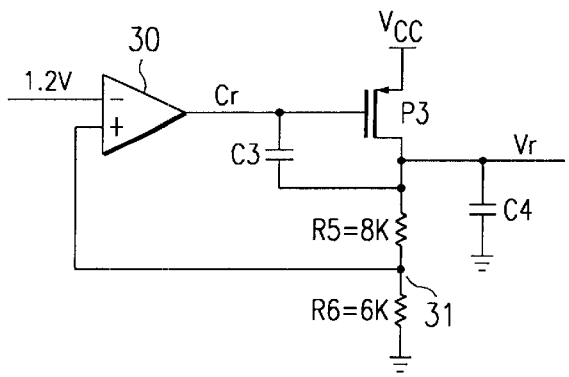
FIG. 4
| TEMPERATURE (C) | V_CC (V) | RISETIME (nS) | FALLTIME (nS) |
|---|---|---|---|
| −40 | 3.0 | 1.873 | 1.850 |
|  | 3.3 | 1.841 | 1.818 |
|  | 3.6 | 1.827 | 1.806 |
| 27 | 3.0 | 1.934 | 1.921 |
|  | 3.3 | 1.914 | 1.897 |
|  | 3.6 | 1.891 | 1.873 |
| 85 | 3.0 | 1.999 | 1.984 |
|  | 3.3 | 1.987 | 1.964 |
|  | 3.6 | 1.967 | 1.949 |
FIG. 5
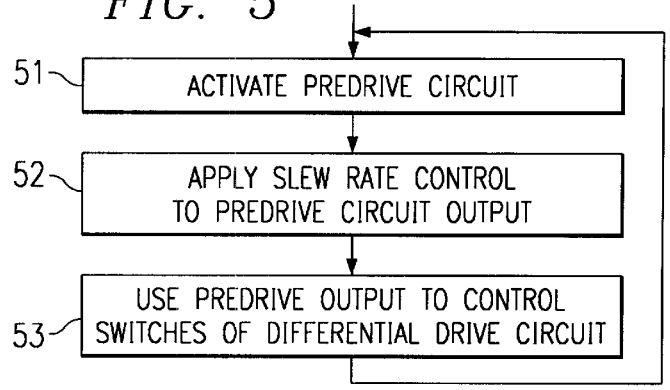

OUTPUT SLEW RATE CONTROL FOR A DIFFERENTIAL TRANSMISSION LINE DRIVER

FIELD OF THE INVENTION

The invention relates generally to data transmission systems and, more particularly, to differential transmission line drivers.

BACKGROUND OF THE INVENTION

FIG. 1 illustrates an example of a conventional low voltage differential driver for driving a differential data transmission line. The example of FIG. 1 is a current mode driver wherein the polarity of the differential output voltage, y-z, is generated by the direction of current flowing through a load resistor Rload of a drive stage 13. The direction of the current flow is controlled by two sets of nMOS (see M1–M4) switches in the drive stage 13, which switches are driven by a predrive stage illustrated at 11. In the illustrated example, if the input signal, in, received by the predrive stage 11 is high, then the signal pos is driven high by operation of predrive switches P2 and M6, and the signal neg is driven low by operation of the predrive switches P1 and M5. Consequently, the drive switches M1 and M4 are turned on and the drive switches M2 and M3 are turned off, so current flows through the load resistor Rload from node y to node z. When the input signal to predrive stage 11 is low, then the signal neg is driven high and the signal pos is driven low, so current flows through the load resistor from node z to node y.

It is well known that electromagnetic interference (EMI) and switching noise in data transmissions can be reduced by slowing down rise and fall times and thereby eliminating fast, noisy transitions. Reflections within a transmission line will interfere with the transmitted signal if the time for the reflection to return to the beginning of the transmission line exceeds the transition time. This reflection time is dependent on the length of the transmission line.

It is therefore desirable to provide for a transmission signal with a longer transition time, because a longer transition time would permit a longer length transmission line.

It can therefore be seen that slew rate control circuitry is often beneficial in data transmission systems, particularly in systems which have relatively long transmission lines. Although output slew rate control has been addressed with respect to the rise and fall times of single-ended buffers, such single-ended techniques do not address the unique characteristics of differential drivers such as illustrated in the example of FIG. 1.

It is therefore desirable to provide output slew rate control for a differential transmission line driver.

The present invention recognizes that, in a current mode differential driver such as the example shown in FIG. 1, the operation of the set of switches M1, M4 interacts with the operation of the set of switches M2, M3 during transitions of the differential output. Accordingly, the present invention further recognizes that these interactions between the operations of the sets of drive switches should be taken into consideration when applying output slew rate control to a differential driver. In this regard, the invention recognizes that, for example, an external capacitor coupled between the outputs y and z of FIG. 1 will reduce the output slew rate of the differential driver without affecting the switching characteristics of the switches M1–M4. However, a capacitor as large as 30 pf may be required to produce transition times greater than 1 ns. The area needed for this capacitance can become disadvantageously large, particularly if a multichannel device is implemented. Furthermore, many conventional data transmission standards, for example LVDS, require the driver to have a low output capacitance.

It is therefore desirable to provide output slew rate control for a differential line driver without increasing the output capacitance of the driver.

According to the invention, the output slew rate of a differential driver can be limited by suitably controlling signal slew rates at the control inputs of the drive switches that control current flow through the load impedance of the differential driver. This advantageously reduces EMI and switching noise, and permits use of longer transmission lines, without increasing the output capacitance of the differential driver.

BRIEF DESCRIPTION OF THE DRAWINGS

FIG. 3 illustrates an exemplary embodiment of the voltage regulator of FIG. 2.

FIG. 4 illustrates in tabular format exemplary differential output voltage transition times achieved by the invention for various combinations of supply voltage and operating temperature.

FIG. 5 illustrates exemplary operations which can be performed by the embodiments of FIG. 2.

DETAILED DESCRIPTION

Figure 1:
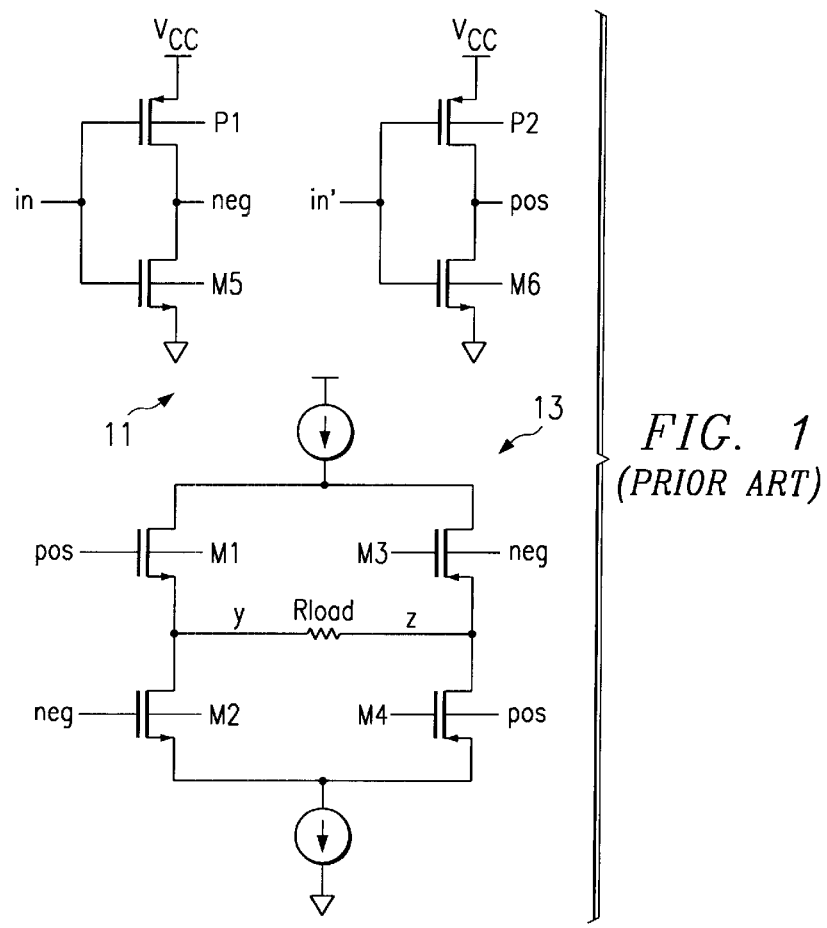
FIG. 1 illustrates a conventional example of a differential transmission line driver.
Figure 2:
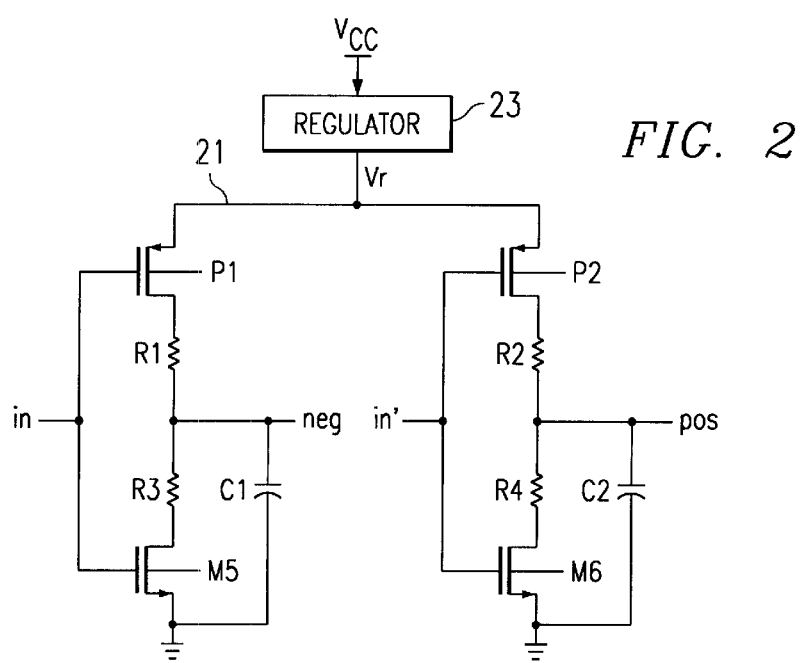
FIG. 2 illustrates exemplary embodiments of a predrive stage for a differential transmission line driver according to the invention.

FIG. 2 illustrates exemplary embodiments of a predrive circuit stage according to the invention which can be used to drive a differential drive circuit stage such as the differential drive stage 13 of FIG. 1. The embodiment of FIG. 2 includes slew rate control circuits embodied as RC circuits. These RC circuits control the slew rates of voltage transitions of the signals neg and pos, that are used to control the drive switches of the differential drive stage. For example neg would control the drive switches M2 and M3 of FIG. 1, and pos would control the drive switches M1 and M4 of FIG. 1, thereby providing the desired slew rate control at the differential output of FIG. 1.

As shown in FIG. 2, the combination of resistor R1 and capacitor C1 controls the time required for predrive switch P1 to charge the neg node from voltage node 21, and the combination of resistor R2 and capacitor C2 controls the time required for the predrive switch P2 to charge the pos node from voltage node 21. Also, the combination of the resistor R3 and capacitor C1 controls the time required for the predrive switch M5 to discharge the neg node to ground potential, and the combination of resistor R4 and capacitor C2 controls the time required for the predrive switch M6 to discharge the pos node to ground potential. The above-described operations with respect to the neg node are permitted by the illustrated series connection of the switch P1 and resistor R1 between the voltage node 21 and the neg node, the series connection of the resistor R3 and the switch M5 between the neg node and ground, and the connection of capacitor C1 between the neg node and ground. The above-described operations with respect to the pos node are permitted by the analogous connection of the elements P2, R2, R4, M6 and C2 with respect to the voltage node 21, the pos node and ground.

The charging resistors R1 and R2 are advantageously much smaller than the discharging resistors R3 and R4, in order to offset suitably the charging and discharging voltage characteristics at the neg and pos nodes. If the RC circuits were symmetrical, the voltage transitions at neg and pos would cross at exactly Vcc/2, which is typically 1.65 volts. This voltage is too low to turn on the drive switches (for example M1–M4 of FIG. 1) of a typical differential drive stage. If the voltages at neg and pos cross at Vcc/2, then all four switches of the differential drive stage would be turned off at that crossing time, effectively disabling the driver.

Accordingly, and as mentioned above, the charging resistors R1 and R2 should typically be much smaller than the discharging resistors R3 and R4 such that, for example, the voltages at neg and pos cross at about 2.1 volts. At this crossing point, all four of the differential drive switches (e.g. M1–M4 of FIG. 1) are conducting simultaneously, but the resistor values of R1–R4 can be selected so that the operation of the set of switches driven by neg (for example M2 and M3 of FIG. 1) and the operation of the set of switches driven by pos (for example M1 and M4 of FIG. 1) do not substantially interfere with one another. In one exemplary embodiment, resistors R1 and R2 are approximately 500 ohms, resistors R3 and R4 are approximately 1800 ohms, and capacitors C1 and C2 are approximately 0.5 pf.

The predrive stage of FIG. 2 also includes a voltage regulator 23 which receives Vcc as input and produces a regulated output voltage Vr at node 21. This regulator 23 is provided because, if the switches P1 and P2 were connected directly to Vcc as in FIG. 1, the RC operational characteristics would change greatly over the possible range of Vcc. In one example, the possible range of Vcc is 3.0 to 3.6 volts. Without the regulator 23, the voltage Vcc would act as the initial voltage of the RC circuits of FIG. 2, thereby resulting in different charging/discharging rates for different values of Vcc. These different charging/discharging rates would cause correspondingly different transition times at the differential output, and would also cause the voltages at neg and pos to cross at correspondingly different points. Thus, changes in Vcc would disadvantageously affect the final output waveform of the differential drive stage.

The voltage regulator 23 is provided as a low dropout linear voltage regulator which produces the regulated voltage Vr. The regulated voltage Vr avoids undesirable variations in the transition times and waveforms produced at the output of the differential driver (for example across the load resistor Rload of FIG. 1). In one embodiment, the regulated voltage Vr is about 2.8 volts, for a Vcc range of 3.0 to 3.6 volts.

FIG. 3 illustrates an exemplary embodiment of the low dropout voltage regulator 23 of FIG. 2. The negative input of an amplifier 30 is connected to a reference voltage of 1.2 V, which reference voltage can be generated by a bandgap circuit. The amplifier 30 regulates node 31 to 1.2V, which, via the two resistors, R5 and R6, generates a voltage of 2.8V at the node Vr. A deviation from 2.8 V at node Vr will cause a corresponding deviation at node 31, which will cause the output of the amplifier 30 to change in order to correct the error. For instance, when the driver (P1/P2 in FIG. 2) switches, node Vr is transiently loaded because it must supply current for the predrive stage. Node Vr, and consequently node 31 are pulled down. This causes a decrease in voltage at the output of the amplifier 30, node Cr, which increases the output current from P3. This current supplies some of the load current needed, and also eventually charges the node Vr back up to 2.8V. Capacitor C3 is coupled between Vr and Cr to improve the response time of the regulator. When Vr is pulled down during transient loading, node Cr will also be immediately pulled down, allowing P3 to begin supplying current before the amplifier kicks in to decrease the voltage at Cr. Capacitor C4 is used as a charge storage device to provide loading current and to minimize the drop in node Vr when the driver (P1/P2 in FIG. 2) switches.

FIG. 4 illustrates in tabular format exemplary rise times and fall times of a differential output signal (for example y-z in FIG. 1) produced by an example implementation of a differential transmission line driver according to the invention, at various Vcc values and various operating temperatures, using the aforementioned exemplary resistor values, using a conventional 0.6 micron BiCMOS process, with the resistors R1, R2, R3 and R4 having a temperature coefficient of 50 ppm, and using an input signal of 100 Mbps. As shown in FIG. 4, and assuming nominal process parameters, the rise times and fall times vary by only about 200 ps (+ or −5%) over Vcc and temperature.

FIG. 5 illustrates exemplary operations which can be performed by the predriver embodiment of FIG. 2. At 51, the predrive circuit is activated by a change in the level of its input signal (in/in'). At 52, slew rate control is applied to an output of the predrive circuit in order to limit the slew rate of the predrive output (neg, pos). At 53, the predrive output is used to control corresponding switches of the differential drive stage (for example, M1–M4 of the differential drive stage shown at 13 in FIG. 1).

As demonstrated above, the present invention provides a relatively simple predrive circuit which can advantageously produce output transition times of a few nanoseconds that vary by an extremely small amount over Vcc and temperature. By maintaining a desired transition time within a specified margin, parameters such as minimum noise, stub length and maximum signaling lengths can advantageously be specified.

Although exemplary embodiments of the invention are described above in detail, this does not limit the scope of the invention, which can be practiced in a variety of embodiments.

What is claimed is:

1. A differential line driver apparatus for driving a transmission line, comprising:

a driver circuit for coupling to said transmission line and having first and second inputs for receiving positive and negative switch signals, respectively, said driver circuit being responsive to said positive and negative switch signals for causing current to flow through said transmission line in first and second directions, respectively; and a predriver circuit coupled to said first and second inputs of said driver circuit, and having first and second inputs for receiving first and second input signals and for providing said positive and negative switch signals in response thereto, and including a voltage regulator connected to a voltage source and providing a regulated voltage, first side driver circuit, including a first transistor having a drain, a source and a gate, a second transistor having a drain, a source and a gate, a first resistor, a second resistor, and a first capacitor, wherein said gate of said first transistor and said gate of said second transistor are coupled to said first input of said predriver circuit, said first resistor and said second resistor being connected in series, their common connection node providing said positive switch signal, said first transistor being connected by its drain and source between said voltage regulator and a first end of said first resistor and said second resistor series connection, said second transistor being connected by its drain and source between a second end of said first resistor and second resistor series connection and ground, said first capacitor being connected between said common connection node of said first resistor and said second resistor and ground, and a second side driver circuit including
  a third transistor having a drain, a source and a gate,
  a fourth transistor having a drain, a source and a gate,
  a third resistor,
  a fourth resistor, and
  a second capacitor,
wherein said gate of said third transistor and said gate of said fourth transistor are coupled to said second input of said predriver circuit, said third resistor and said fourth resistor being connected in series, their common connection node providing said negative switch signal, said third transistor being connected by its drain and source between said voltage regulator and a first end of said third resistor and said fourth resistor series connection, said third transistor being connected by its drain and source between a second end of said third resistor and fourth resistor series connection and ground, said second capacitor being connected between said common connection node of said third resistor and said fourth resistor and ground.

2. A differential line driver apparatus according to claim 1 wherein said first and said third resistors are connected to said first and third transistors, respectively, and wherein said first and third transistors are substantially smaller than said second and fourth resistors.

3. A differential line driver apparatus according to claim 2 wherein said first and third resistors are approximately 500 ohms, wherein said second and fourth transistors are approximately 1800 ohms, and wherein said first and second capacitors are approximately 0.5 pf.

4. A differential line driver apparatus according to claim 2 wherein the values of said first, second, third and fourth resistors and of said first and second capacitors are selected to cause the said positive and negative switch signals to cross at a voltage at which said first, second, third and fourth transistors conduct.

* * * * *